(12) United States Patent
Cho

(10) Patent No.: US 8,598,889 B2
(45) Date of Patent: Dec. 3, 2013

(54) IMPEDANCE CALIBRATION CIRCUIT

(75) Inventor: Jin Hee Cho, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 413 days.

(21) Appl. No.: 12/970,858

(22) Filed: Dec. 16, 2010

(65) Prior Publication Data
US 2012/0002697 A1   Jan. 5, 2012

(30) Foreign Application Priority Data

Jul. 2, 2010  (KR) .................... 10-2010-0063997

(51) Int. Cl.
*G01R 35/00*  (2006.01)
(52) U.S. Cl.
USPC .................. 324/601; 326/30; 365/189.04
(58) Field of Classification Search
USPC .............. 324/601; 326/30; 365/189.5, 189.04
See application file for complete search history.

(56) References Cited

U.S. PATENT DOCUMENTS

| | | | |
|---|---|---|---|
| 6,049,221 A * | 4/2000 | Ishibashi et al. ............... | 326/30 |
| 7,579,861 B2 * | 8/2009 | Shin et al. .................... | 326/26 |
| 7,633,310 B2 * | 12/2009 | Fukushi ....................... | 326/30 |
| 2005/0276126 A1 * | 12/2005 | Choi et al. .................. | 365/189.05 |
| 2010/0308861 A1 * | 12/2010 | Lee ............................. | 326/30 |

FOREIGN PATENT DOCUMENTS

| | | |
|---|---|---|
| JP | 2006-319965 | 11/2006 |
| KR | 1020080108853 A | 12/2008 |
| KR | 1020100003065 A | 1/2010 |

OTHER PUBLICATIONS

Application # 12970858. Background/Prior Art.*

* cited by examiner

*Primary Examiner* — Patrick Assouad
*Assistant Examiner* — Sean Curtis
(74) *Attorney, Agent, or Firm* — William Park & Associates Patent Ltd

(57) ABSTRACT

Various embodiments of an impedance calibration circuit are disclosed. In one exemplary embodiment, the impedance calibration circuit may include a control unit configured to generate a plurality of first internal commands for defining an impedance calibration operation in response to an external signal, a temperature-adaptive control unit configured to generate a second internal command for defining an impedance calibration operation by detecting a temperature change, a timer counter configured to generate an operation control signal that prescribes a duration of time for an impedance calibration operation in response to the plurality of first internal commands and the second internal command, and an impedance calibration signal generation unit configured to operate for a predetermined time defined by the operation control signal and generate impedance calibration signals.

15 Claims, 7 Drawing Sheets

IMPEDANCE CALIBRATION CIRCUIT

CROSS-REFERENCES TO RELATED APPLICATION

The present application claims priority under 35 U.S.C. §119(a) to Korean Application No. 10-2010-0063997, filed on Jul. 2, 2010, in the Korean Intellectual Property Office, which is incorporated herein by reference in its entirety as if set forth in full.

BACKGROUND

1. Technical Field

The present invention relates to a semiconductor circuit, and more particularly, to an impedance calibration circuit which may be used in a semiconductor apparatus, specifically in a semiconductor memory apparatus.

2. Related Art

As an electronic system operates at a high speed, data is also transmitted at a high speed across semiconductor circuits which constitute the system.

In order to achieve high data transmission, matching the impedance of a data transmission path with the output impedance of an output circuit is necessary.

In particular, the semiconductor memory apparatus, which is a representative example of a semiconductor circuit, may include an impedance calibration circuit to match output impedance with the impedance of a transmission path by calibrating the output impedance.

The impedance calibration circuit may perform an impedance calibration operation in response to an externally inputted impedance calibration command ZQC.

According to an operation standard for a semiconductor memory related to impedance calibration, the impedance calibration command ZQC may be defined by a combination of CS/, RAS/, CAS/ and WE/.

The impedance calibration command ZQC may be classified as a ZQ calibration long (ZQCL) and a ZQ calibration short (ZQCS), and the ZQCL is distinguished from the ZQCS by an address signal A<10>.

The ZQCL may be provided in an initial operation of a semiconductor circuit. The ZQCL is a command that instructs to perform a long-term impedance calibration operation (such as, for example, 256 tCK or 512 tCK) as compared with the ZQCS.

Meanwhile, the ZQCS may be provided after the ZQCL is completed. The ZQCS is a command that instructs to perform a short-term impedance calibration operation (such as, for example, 64 tCK) as compared with the ZQCL.

FIG. 1 is an illustration of an example of a conventional impedance calibration circuit, which includes a control unit 10, a timer counter 20, and an impedance calibration signal generation unit 30.

The control unit 10 may generate a plurality of internal commands iZQCS, ZQINIT and ZQOPER. The plurality of internal commands iZQCS, ZQINIT and ZQOPER instruct to perform an impedance calibration operation in response to an impedance calibration command ZQC, an address signal A<10> and a reset signal RESETB.

Among them, the internal command iZQCS may be generated by the ZQCS and the internal commands ZQINIT and ZQOPER may be generated by the ZQCL.

The timer counter 20 may generate an operation control signal CAL_OPER that prescribes the duration of time for the impedance calibration operation in response to the plurality of internal commands iZQCS, ZQINIT and ZQOPER by using a clock signal CLK.

The impedance calibration signal generation unit 30 may operate for a predetermined time defined by the operation control signal CAL_OPER to generate impedance calibration signals PCODE<0:N> and NCODE<0:N>.

The impedance calibration signal generation unit 30 may include a plurality of comparators 31 and 34, a plurality of counters 32 and 35, and a plurality of digital-to-analog converters 33, 36 and 37.

The digital-to-analog converters 33 and 36 are designed by modeling a pull-up driver of a data output driver, and the digital-to-analog converter 37 is designed by modeling a pull-down driver of the data output driver.

The digital-to-analog converter 33 may be coupled to an external resistor RZQ through a pad ZQ.

The impedance calibration signal generation unit 30 may change the values of the impedance calibration signals PCODE<0:N> such that a voltage level (such as, for example, a ZQ node voltage) obtained by converting the impedance calibration signals PCODE<0:N> in the form of a digital code through the digital-to-analog converter 33 is substantially identical to a reference voltage.

Furthermore, the impedance calibration signal generation unit 30 may input the impedance calibration signals PCODE<0:N> to the digital-to-analog converter 36, and may change the values of the impedance calibration signals NCODE<0:N> such that a voltage level (such as, for example, a NA node voltage) obtained by converting the impedance calibration signals NCODE<0:N> through the digital-to-analog converter 37 is substantially identical to the reference voltage.

FIG. 2 is a timing diagram illustrating impedance calibration operation timing obtained by the conventional impedance calibration signal generation unit 30. Referring to FIG. 2, the impedance calibration operation may be performed for a predetermined time defined by the internal commands ZQINIT and ZQOPER generated in response to the ZQCL in an initial operation of the semiconductor circuit.

The impedance calibration signals PCODE<0:N> and NCODE<0:N> changed through the impedance calibration are provided to a data output driver, so that the output impedance of the semiconductor circuit is calibrated to be substantially identical to a target impedance, that is, the impedance of the external resistor RZQ.

As described above, after the impedance calibration operation in response to the ZQCL is completed, an impedance calibration operation may be performed with a random period of time defined by the internal command iZQCS generated in response to the ZQCS.

Meanwhile, since the semiconductor circuit is used in various application fields, the semiconductor circuit has various temperature conditions according to regions and application in which the semiconductor circuit is used.

For example, in the case where a semiconductor memory in a vehicle navigation system is used in an extremely high temperature region or low temperature region, a temperature change may occur due to an increase or decrease in internal temperature while a vehicle is running as compared with the initial temperature when the vehicle is first started up.

FIG. 2, is an illustration of an exemplary situation showing that after the impedance calibration operation in response to the ZQCL is completed, a temperature change may occur in the temperature range as indicated by P_T1 to P_T4.

However, according to the conventional art, the impedance calibration operation in response to the ZQCS may be performed regardless of the above-described temperature change.

Therefore, as in FIG. 3 which illustrates a change in an impedance value according to the conventional art, after the output impedance of the semiconductor circuit is calibrated to a normal value, such as a value substantially identical to the impedance of the external resistor RZQ, through the impedance calibration operation in response to the ZQCL, impedance miss-matching, in which impedance changes like Case A or Case B, may occur due to the impedance calibration operation in response to the ZQCS, which does not consider a temperature change.

SUMMARY

Accordingly, there is a need for an improved impedance calibration circuit that may obviate the above-mentioned problem. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

According to one aspect of the invention, an impedance calibration circuit includes: a control unit configured to generate a plurality of first internal commands for defining an impedance calibration operation in response to an external signal; a temperature-adaptive control unit configured to generate a second internal command for defining an impedance calibration operation by detecting a temperature change; a timer counter configured to generate an operation control signal that prescribes a duration of time for an impedance calibration operation in response to the plurality of first internal commands and the second internal command; and an impedance calibration signal generation unit configured to operate for a predetermined time defined by the operation control signal and generate impedance calibration signals.

According to another aspect of the invention, an impedance calibration circuit includes: a control unit configured to generate a first internal command for defining a long impedance calibration operation in response to an external signal; a temperature-adaptive control unit configured to generate a second internal command for defining a short impedance calibration operation by detecting a temperature change; a timer counter configured to generate an operation control signal that prescribes a duration of time for an impedance calibration operation in response to the first internal command and the second internal command; and an impedance calibration signal generation unit configured to operate for a predetermined time defined by the operation control signal and generate impedance calibration signals.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
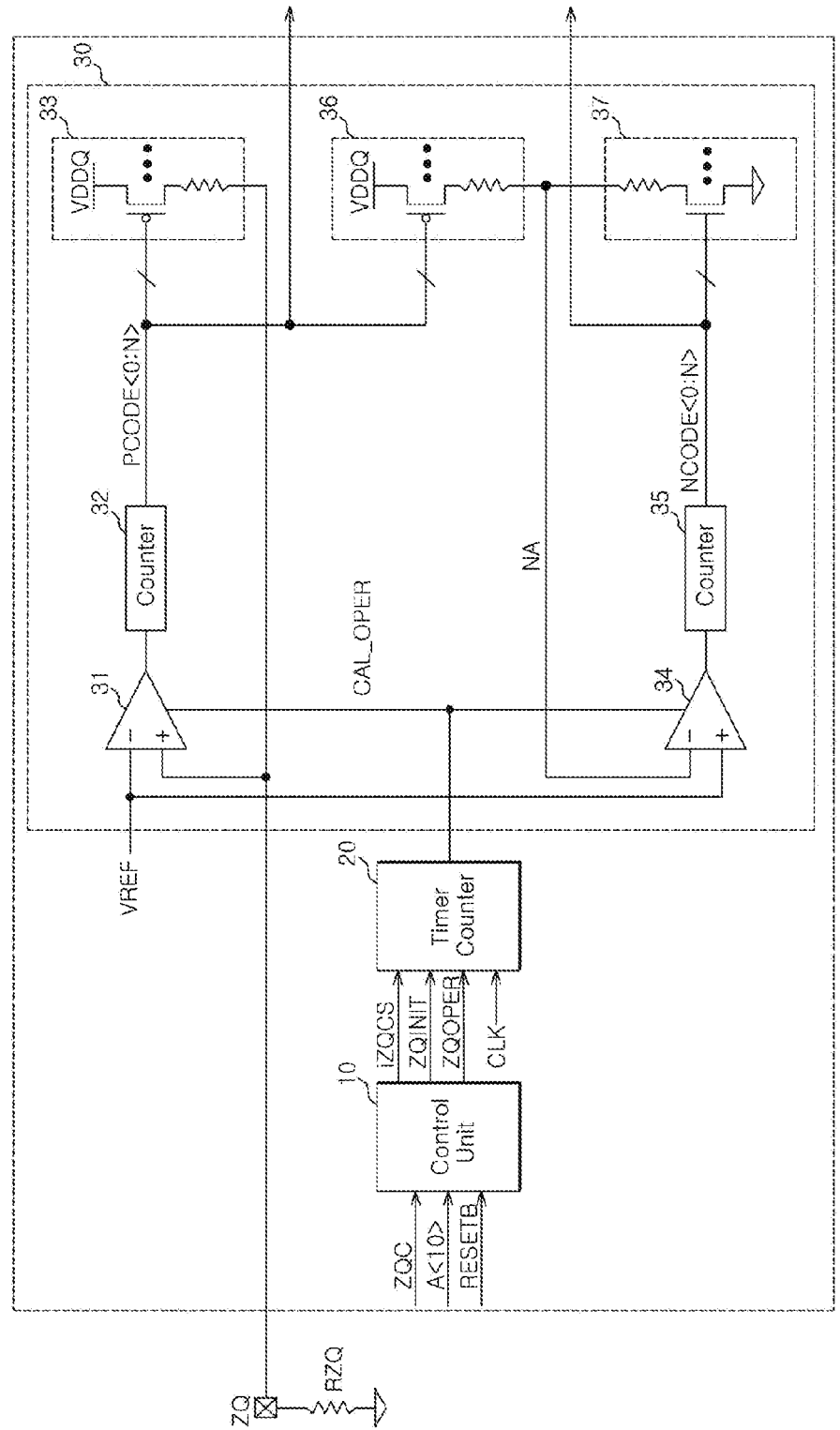
FIG. 1 is a block diagram of a conventional impedance calibration circuit.
Figure 2:
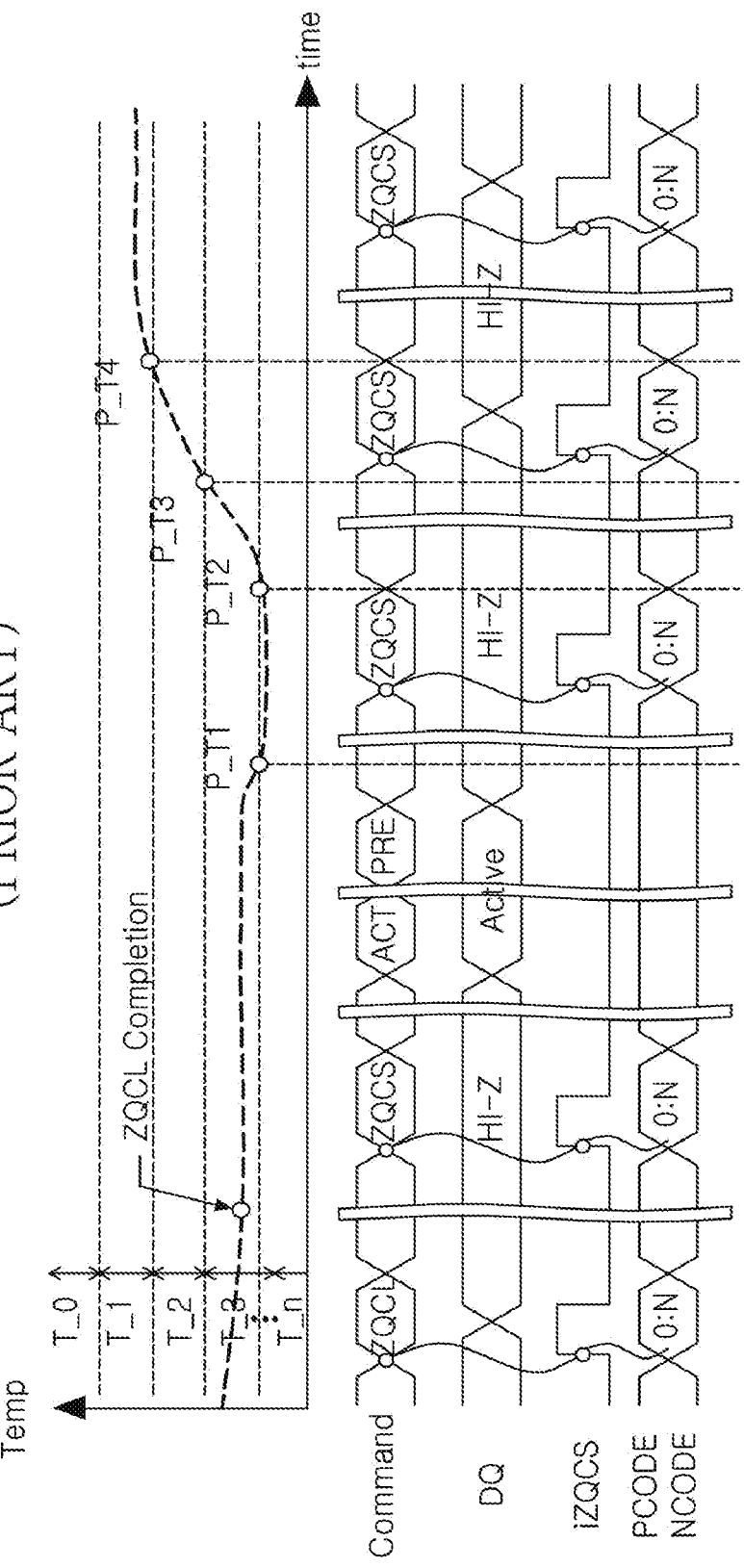
FIG. 2 is a timing diagram illustrating a conventional impedance calibration operation timing.
Figure 3:
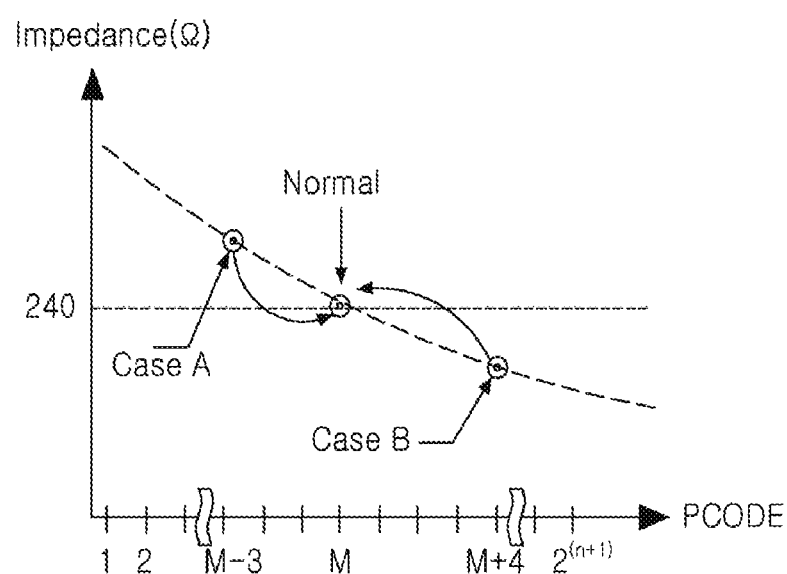
FIG. 3 is a graph illustrating a change in an impedance value according to the conventional art.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 4:
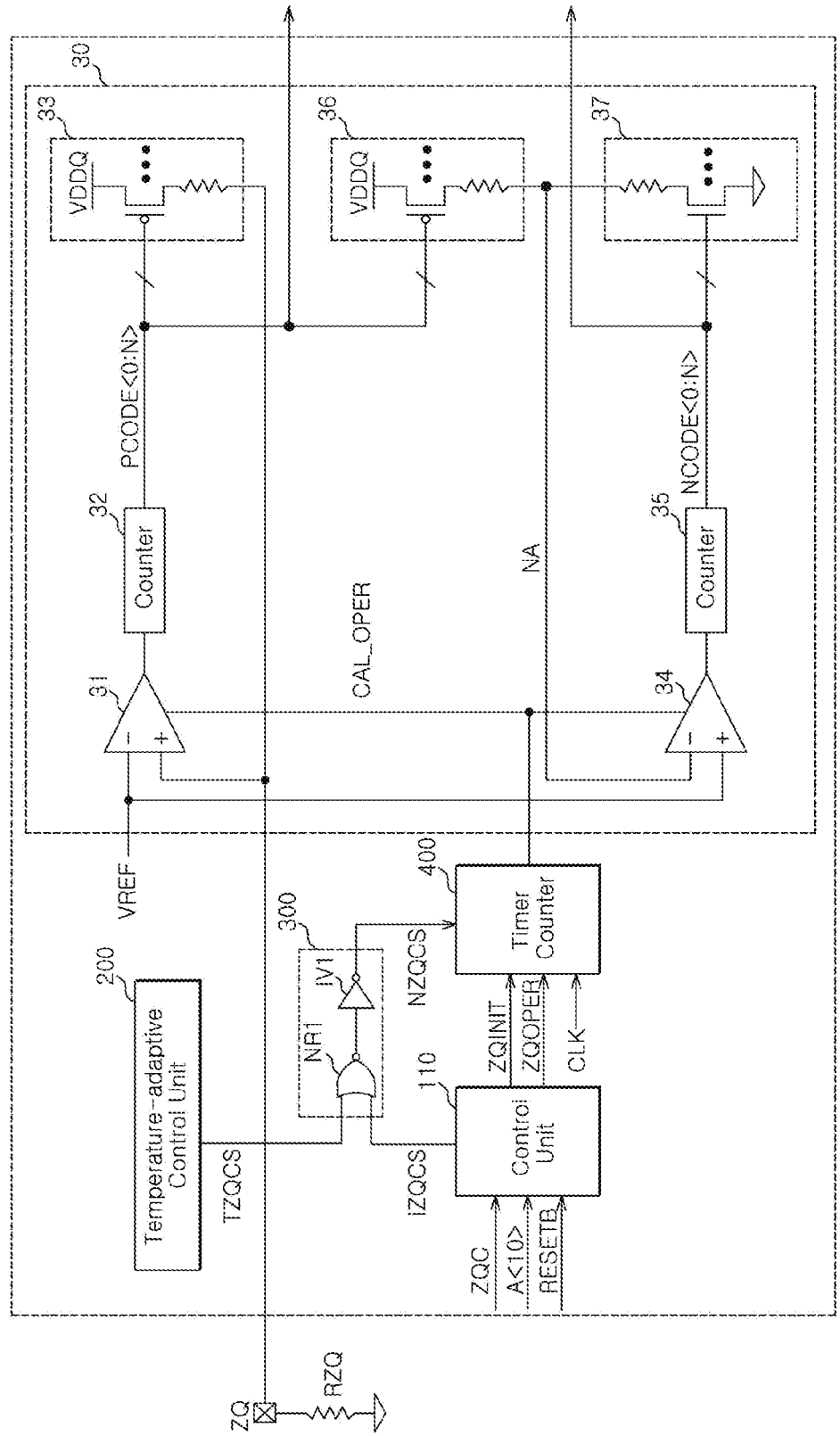
FIG. 4 is a block diagram of an impedance calibration circuit according to one exemplary embodiment.

FIG. 4 is an illustration of an exemplary impedance calibration circuit 100 according to an embodiment which includes a control unit 110, a temperature-adaptive control unit 200, a combination unit 300, a timer counter 400, and an impedance calibration signal generation unit 30.

The control unit 110 may be configured to generate a plurality of first internal commands iZQCS, ZQINIT and ZQOPER. The plurality of first internal commands iZQCS, ZQINIT and ZQOPER instruct to perform an impedance calibration operation, in response to external signals.

The external signals may include an impedance calibration command ZQC, an address signal A<10> and a reset signal RESETB. The internal command iZQCS may be generated by a ZQ calibration short (ZQCS) and the internal commands ZQINIT, and ZQOPER may be generated by a ZQ calibration long (ZQCL).

The temperature-adaptive control unit 200 may be configured to generate a internal command TZQCS. The internal command TZQCS instructs to perform an impedance calibration operation, by detecting a temperature change.

The combination unit 300 may be configured to provide the timer counter 400 with an internal command NZQCS obtained by combining the internal command iZQCS with the internal command TZQCS.

The combination unit 300 may be configured to activate the internal command NZQCS if any one of the internal command iZQCS and the internal command TZQCS is activated.

The combination unit 300 may include a NOR gate NR1 and an inverter IV1.

The timer counter 400 may be configured to generate an operation control signal CAL_OPER that prescribes a duration of time for an impedance calibration operation in response to the internal commands ZQINIT and ZQOPER and the internal command NZQCS by using a clock signal CLK.

The impedance calibration signal generation unit 30 may be configured to operate for a predetermined time defined by the operation control signal CAL_OPER and generate impedance calibration signals PCODE<0:N> and NCODE<0:N> in the form of digital codes.

The impedance calibration signal generation unit 30 may include a plurality of comparators 31 and 34, a plurality of counters 32 and 35, and a plurality of digital-to-analog converters 33, 36 and 37.

The digital-to-analog converters 33 and 36 may be designed by modeling a pull-up driver of a data output driver, and the digital-to-analog converter 37 may be designed by modeling a pull-down driver of the data output driver.

The digital-to-analog converter 33 may be configured to be coupled to an external resistor RZQ through a pad ZQ.

The impedance calibration signal generation unit 30 may be configured to change the values of the impedance calibration signals PCODE<0:N> such that a conversion voltage (that is, a ZQ node voltage) obtained by converting the impedance calibration signals PCODE<0:N> through the digital-to-analog converter 33 is substantially identical to a reference voltage.

Furthermore, the impedance calibration signal generation unit 30 may be configured to input the impedance calibration signals PCODE<0:N> to the digital-to-analog converter 36, and change the values of the impedance calibration signals NCODE<0:N> such that a voltage level (such as, for example, a NA node voltage) obtained by converting the impedance calibration signals NCODE<0:N> through the digital-to-analog converter 37 is substantially identical to the reference voltage.

Figure 5:
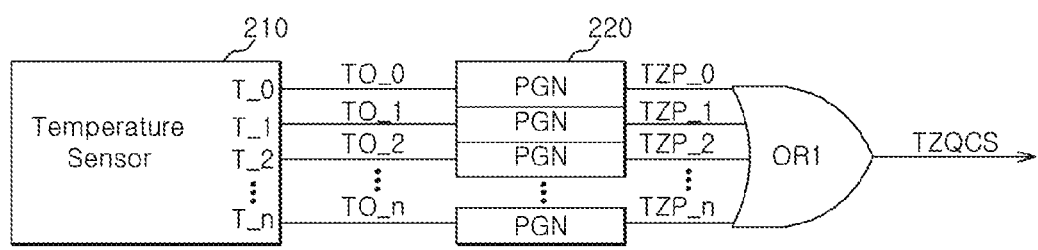
FIG. 5 is a circuit diagram of a temperature-adaptive control unit illustrated in FIG. 4.

FIG. 5, is an illustration of an exemplary temperature-adaptive control unit 200 which is configured to generate the internal command TZQCS by detecting a change in the range to which current temperature belongs among a plurality of preset temperature ranges.

The temperature-adaptive control unit 200 may include a temperature sensor 210, a plurality of pulse generators PGN 220, and a logic device OR1.

The temperature sensor 210 may be configured to divide, such as, for example, −40° C. to 100° C. into a plurality of temperature ranges T_0 to T_n and generate temperature detection signals T0_0 to T0_n based on the range to which current temperature belongs among the plurality of temperature ranges T_0 to T_n.

The plurality of pulse generators 220 may be configured to generate a plurality of pulse signals TZP_0 to TZP_n in response to the temperature detection signals T0_0 to T0_n.

The logic device OR1 may be configured to activate the internal command TZQCS if any one of the plurality of pulse signals TZP_0 to TZP_n is activated.

Figure 6:
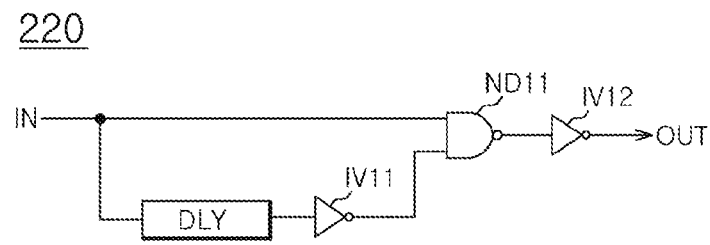
FIG. 6 is a circuit diagram of a pulse generator illustrated in FIG. 5.

FIG. 6, is an illustration of an exemplary pulse generator 220 which may include a delay section DLY, a NAND gate ND11, and a plurality of inverters IV11 and IV12.

Figure 7:
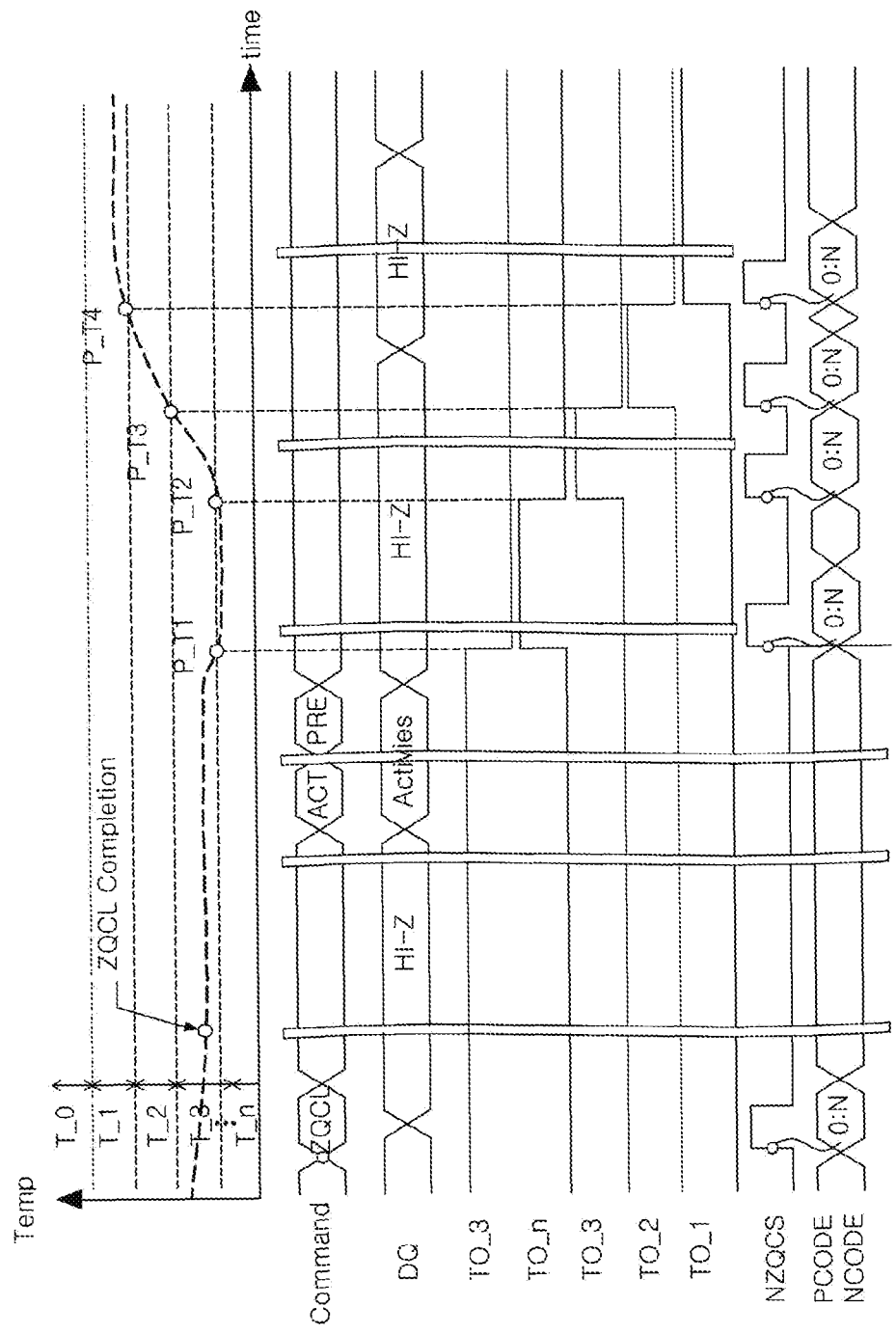
FIG. 7 is a timing diagram illustrating an impedance calibration operation timing according to one exemplary embodiment.

FIG. 7 is an illustration of an exemplary impedance calibration operation of the impedance calibration circuit according to an embodiment.

The long impedance calibration operation may be performed for a time, such as, for example, 256 tCK or 512 tCK in response to the internal commands ZQINIT and ZQOPER generated based on the ZQ calibration long (ZQCL) in an initial operation of the semiconductor circuit.

The impedance calibration signals PCODE<0:N> and NCODE<0:N> changed through the impedance calibration are provided to a data output driver, so that the output impedance of the semiconductor circuit is calibrated to be substantially identical to a target impedance, that is, the impedance of the external resistor RZQ.

After the impedance calibration operation based on the ZQCL is completed, the short impedance calibration operation may be performed based on the internal command NZQCS.

The internal command NZQCS may be generated when any one of the internal command iZQCS and the internal command TZQCS is activated.

While the internal command iZQCS is generated in response to an external command, the internal command TZQCS is generated based on internal temperature detection.

That is, the temperature-adaptive control unit 200 can generate the internal command TZQCS whenever a change occurs in the range to which the current temperature belongs among the plurality of temperature ranges T_0 to T_n such as P_T1 to P_T4.

Thus, the short impedance calibration operation may be performed for a time, such as, for example, 64 tCK, based on the internal command NZQCS generated whenever a temperature change occurs.

Hereinafter, another exemplary embodiment will be described with reference to the accompanying drawings.

Figure 8:
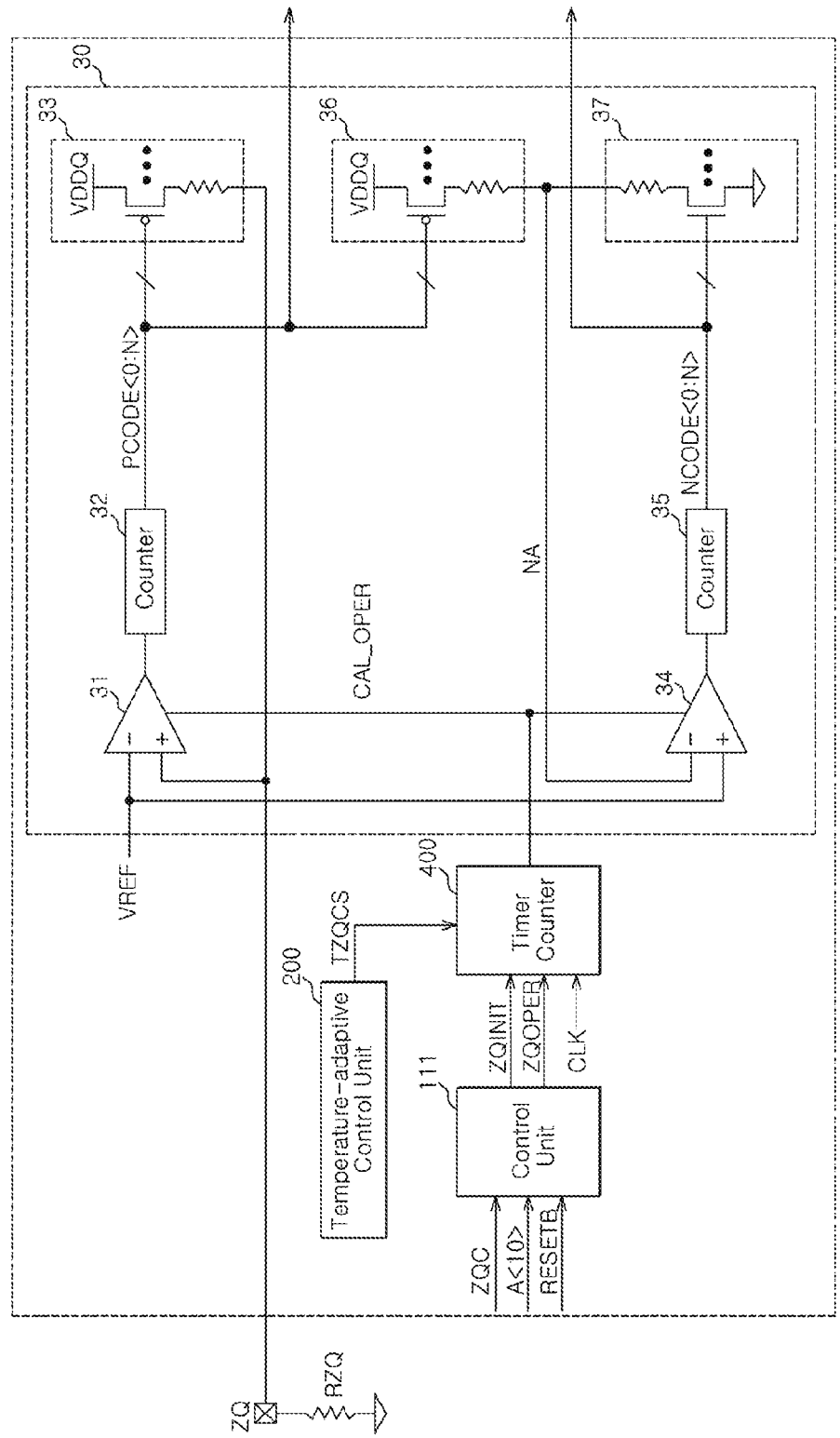
FIG. 8 is a block diagram of an impedance calibration circuit according to another exemplary embodiment.

FIG. 8 is an illustration of an exemplary impedance calibration circuit 101 according to another embodiment, which may include a control unit 111, a temperature-adaptive control unit 200, a timer counter 400, and an impedance calibration signal generation unit 30.

According to another embodiment, the temperature-adaptive control unit 200 is dedicated for controlling the short impedance calibration operation.

That is, according to another embodiment, the control unit 111 does not generate the internal command iZQCS in response to the ZQ calibration short (ZQCS), and the internal command TZQCS generated in the temperature-adaptive control unit 200 is directly input to the timer counter 400.

The temperature-adaptive control unit 200 may be configured to detect a temperature change which may have the greatest influence on an impedance change, and generate a signal (that is, the internal command TZQCS) for the short impedance calibration operation in correspondence to the detected temperature change.

The internal command iZQCS may be generated by an external command instead of direct temperature detection.

Thus, according to another embodiment, the circuit as illustrated in FIG. 8 may be configured in consideration that the short impedance calibration operation based on the internal command iZQCS may not be necessary.

Meanwhile, since the temperature-adaptive control unit 200, the timer counter 400, and the impedance calibration signal generation unit 30 may have the same configuration as those of the embodiments illustrated in FIGS. 4 to 6 and the impedance calibration operation may be substantially identical to that illustrated in FIG. 7, the configuration and operation description thereof will be omitted.

According to an exemplary embodiment, an impedance calibration operation is performed by detecting a temperature change, so that a change in an impedance value according to the temperature change is appropriately compensated, resulting in the improvement of impedance calibration efficiency.

While certain embodiments have been described above, it will be understood to those skilled in the art that the embodiments described are by way of example only. Accordingly, the impedance calibration circuit described herein should not be limited based on the described embodiments. Rather, the impedance calibration circuit described herein should only be limited in light of the claims that follow when taken in conjunction with the above description and accompanying drawings.

What is claimed is:
1. An impedance calibration circuit comprising:
a control unit configured to generate a plurality of first internal commands for defining an impedance calibration operation in response to an external signal;

a temperature-adaptive control unit configured to generate a second internal command for defining an impedance calibration operation by detecting a temperature change;

a timer counter configured to generate an operation control signal that prescribes a duration of time for an impedance calibration operation in response to the plurality of first internal commands and the second internal command; and an impedance calibration signal generation unit configured to operate for a predetermined time defined by the operation control signal and generate impedance calibration signals, wherein the second internal command defines a short impedance calibration operation.

2. The impedance calibration circuit according to claim 1, wherein the external signal is an impedance calibration command inputted from an outside signal and an address signal.

3. The impedance calibration circuit according to claim 1, wherein the plurality of first internal commands include a command for defining a short impedance calibration operation and a command for defining a long impedance calibration operation.

4. The impedance calibration circuit according to claim 1, wherein the temperature-adaptive control unit is configured to generate the second internal command for defining an impedance calibration operation by detecting a temperature change in a range to which current temperature belongs among a plurality of preset temperature ranges.

5. The impedance calibration circuit according to claim 1, wherein the temperature-adaptive control unit comprises:
  a temperature sensor configured to generate temperature detection signals based on the range to which the current temperature belongs among a plurality of temperature ranges;
  a plurality of pulse generators configured to generate a plurality of pulse signals in response to the temperature detection signals; and
  a logic device configured to activate the second internal command if any one of the plurality of pulse signals is activated.

6. The impedance calibration circuit according to claim 1, further comprising a combination unit configured to provide the timer counter with a result obtained by combining a command of the plurality of first internal commands, which defines a short impedance calibration operation, with the second internal command.

7. The impedance calibration circuit according to claim 1, wherein the impedance calibration signal generation unit is configured to change code values of the impedance calibration signals in response to a comparison result obtained by comparing a conversion voltage, which is obtained by converting the impedance calibration signals in a form of a digital code, with a reference voltage.

8. The impedance calibration circuit according to claim 1, wherein the impedance calibration signal generation unit comprises:
  a comparator configured to output the comparison result obtained by comparing the reference voltage with the conversion voltage;
  a counter configured to change the code values of the impedance calibration signals in response to an output signal of the comparator; and
  a digital-to-analog converter configured to generate the conversion voltage by converting the impedance calibration signals.

9. The impedance calibration circuit according to claim 8, wherein the digital-to-analog converter is coupled to an external resistor through a pad.

10. An impedance calibration circuit comprising:
  a control unit configured to generate a first internal command for defining a long impedance calibration operation in response to an external signal;
  a temperature-adaptive control unit configured to generate a second internal command for defining a short impedance calibration operation by detecting a temperature change;
  a timer counter configured to generate an operation control signal that prescribes a duration of time for an impedance calibration operation in response to the first internal command and the second internal command; and
  an impedance calibration signal generation unit configured to operate for a predetermined time defined by the operation control signal and generate impedance calibration signals,
  wherein the temperature-adaptive control unit comprises:
  a temperature sensor configured to generate temperature detection signals based on the range to which the current temperature belongs among the plurality of temperature ranges;
  a plurality of pulse generators configured to generate a plurality of pulse signals in response to the temperature detection signals; and
  a logic device configured to activate the second internal command if any one of the plurality of pulse signals is activated.

11. The impedance calibration circuit according to claim 10, wherein the external signal is an impedance calibration command inputted from an outside signal and an address signal.

12. The impedance calibration circuit according to claim 10, wherein the temperature-adaptive control unit is configured to detect a temperature change in a range to which current temperature belongs among a plurality of preset temperature ranges.

13. The impedance calibration circuit according to claim 10, wherein the impedance calibration signal generation unit is configured to change code values of the impedance calibration signals in response to a comparison result obtained by comparing a conversion voltage, which is obtained by converting the impedance calibration signals in a form of a digital code, with a reference voltage.

14. The impedance calibration circuit according to claim 10, wherein the impedance calibration signal generation unit comprises:
  a comparator configured to output the comparison result obtained by comparing the reference voltage with the conversion voltage;
  a counter configured to change the code values of the impedance calibration signals in response to an output signal of the comparator; and
  a digital-to-analog converter configured to generate the conversion voltage by converting the impedance calibration signals.

15. The impedance calibration circuit according to claim 14, wherein the digital-to-analog converter is coupled to an external resistor through a pad.

* * * * *